(12) United States Patent
Ismayilov et al.

(10) Patent No.: US 9,510,475 B2
(45) Date of Patent: Nov. 29, 2016

(54) MECHANICAL ASSEMBLY AND METHOD TO PROVIDE FORM-FACTOR AND WIRE ALIKE ADAPTATION OF EXISTING PLATFORM HARDWARE MODULES INTO NEW PRODUCTS

(71) Applicant: ABB Technology AG, Zurich (CH)

(72) Inventors: Shamsi Ismayilov, Conshohocken, PA (US); Yaser A. Khalifa, New Paltz, PA (US); Frantisek Koudelka, Brno (CZ); Arkady Oksengorn, Boca Raton, FL (US); Siu Lau, Hampton, NJ (US); Hardik Patel, Bethlehem, PA (US); In Y. Choi, Pymouth Meeting, PA (US)

(73) Assignee: ABB Schweiz AG, Zurich (CH)

( * ) Notice: Subject to any disclaimer, the term of this patent is extended or adjusted under 35 U.S.C. 154(b) by 582 days.

(21) Appl. No.: 14/013,077

(22) Filed: Aug. 29, 2013

(65) Prior Publication Data

US 2015/0062833 A1    Mar. 5, 2015

(51) Int. Cl.
*H05K 7/00* (2006.01)
*H05K 7/14* (2006.01)
*H05K 3/32* (2006.01)

(52) U.S. Cl.
CPC ............ *H05K 7/1432* (2013.01); *H05K 3/32* (2013.01); *H05K 7/1464* (2013.01); *Y10T 29/4913* (2015.01)

(58) Field of Classification Search
CPC .... H05K 7/1432; H05K 7/1492; H05K 7/02; G06F 1/181; G06F 1/183; G06F 11/2033; G06F 1/263; G06F 9/5061
See application file for complete search history.

(56) References Cited

U.S. PATENT DOCUMENTS 6,243,273 B1    6/2001    Beun
D683,706 S       6/2013    Kangas
(Continued)

FOREIGN PATENT DOCUMENTS

EP    0653906 A1    5/1995
EP    2246954 A1    11/2010
(Continued)

OTHER PUBLICATIONS

International Search Report & Written Opinion in PCT/US2014/053599 dated Dec. 17, 2014.
(Continued)

*Primary Examiner* — Robert J Hoffberg
*Assistant Examiner* — Hung Dang
(74) *Attorney, Agent, or Firm* — Manelli Selter PLLC; Edward J. Stemberger

(57) ABSTRACT

An Intelligent Electronic Device (IED) includes a plurality of hardware modules including a pair of analog input modules (AIM) modules, a Power Supply Module (PSM), and a Binary Input/Output (BIO) module. Each module is configured for mounting in a first IED housing that has a first form factor. The PSM and BIO module are constructed and arranged to directly connect with electrical connections of the first housing. A second IED housing is provided that has a second form factor that is different from the first form factor. The AIM modules are mounted to a bottom panel of the second housing. The PSM and the BIO module are mounted in the second housing. Wiring electrically connects the AIM modules to connections on the second housing. Adaptor structure electrically connects the PSM and the BIO module with associated connections of the second housing.

19 Claims, 4 Drawing Sheets

(56) References Cited

U.S. PATENT DOCUMENTS

| | | |
|---|---|---|
| 2001/0012733 A1 | 8/2001 | Schmidt et al. |
| 2007/0067119 A1* | 3/2007 | Loewen ............... G01R 22/065 702/57 |
| 2010/0008053 A1 | 1/2010 | Osternack |

FOREIGN PATENT DOCUMENTS

| | | |
|---|---|---|
| EP | 2389054 | 11/2011 |
| WO | 03063565 A1 | 7/2003 |
| WO | 2004100633 | 11/2004 |
| WO | 2004100634 | 11/2004 |
| WO | 2004100635 | 11/2004 |

OTHER PUBLICATIONS

"Relion 670 series Line differential protection RED670 Installation and commissioning manual" XP055157623, Product Version 1.2, Revision C, pp. 1-78, dated Dec. 31, 2012.

* cited by examiner

MECHANICAL ASSEMBLY AND METHOD TO PROVIDE FORM-FACTOR AND WIRE ALIKE ADAPTATION OF EXISTING PLATFORM HARDWARE MODULES INTO NEW PRODUCTS

FIELD

The invention relates to intelligent Electronic Devices (IED) and, more particularly, to the integration of state of the art IED hardware modules and/or printed circuit boards into an existing wiring and form factor environment.

BACKGROUND

Intelligent Electronic Devices (IED) are typically used for protection, management and supervision of utility substations and industrial power systems. IEDs are durable electronic equipment that, during their designed life, would span across a number of technological advancements and changes. These changes could affect not only the hardware electronics, but also the form factor and size of that hardware. Replacing older IEDs with similar ones is quite difficult since technologies used in the original IED would have been outdated and components would have reached their End Of Life (EOL). Replacing an older technology IED with a more recent one very often requires changing wiring and sometimes dimensions of racks and panels if a new IED form factor is introduced or a different user Input/output interface is used.

Thus, there is a need to permit the transfer and integration of current technology into older IEDs' form-factor while keeping the customer wiring locations unchanged.

SUMMARY

An object of the invention is to fulfill the need referred to above. In accordance with the principles of the present invention, this objective is obtained by a method of providing an Intelligent Electronic Device (IED) with new hardware modules. The method provides hardware modules including a pair of Analog Input Modules (AIM) modules, a Power Supply Module (PSM), and a Binary Input/Output (BIO) module. Each module is configured for mounting in a first IED housing that has a first form factor, with the PSM and BIO module being constructed and arranged to directly connect with electrical connections of the first housing. A second IED housing is provided having a second form factor that is different from the first form factor. The AIM modules are mounted in the second housing. The AIM modules are wired to connections at a back panel of the second housing. The PSM and the BIO module are also mounted in the second housing. Adaptor structure is employed to electrically connect the PSM and the BIO module with associated connections of the second housing.

In accordance with another aspect of the disclosed embodiment, an Intelligent Electronic Device (IED) includes a plurality of hardware modules including a pair of analog input modules (AIM) modules, a Power Supply Module (PSM), and a Binary Input/Output (BIO) module. Each module is configured for mounting in a first IED housing that has a first form factor. The PSM and BIO module are constructed and arranged to directly connect with electrical connections of the first housing. A second IED housing is provided that has a second form factor that is different from the first form factor. The AIM modules are mounted to a bottom panel of the second housing. The PSM and the BIO module are mounted in the second housing. Wiring electrically connects the AIM modules to connections on the second housing. Adaptor structure electrically connects the PSM and the BIO module with associated connections of the second housing.

Other objects, features and characteristics of the present invention, as well as the methods of operation and the functions of the related elements of the structure, the combination of parts and economics of manufacture will become more apparent upon consideration of the following detailed description and appended claims with reference to the accompanying drawings, all of which form a part of this specification.

BRIEF DESCRIPTION OF THE DRAWINGS

The invention will be better understood from the following detailed description of the preferred embodiments thereof, taken in conjunction with the accompanying drawings, wherein like reference numerals refer to like parts, in which.

DETAILED DESCRIPTION OF EXEMPLARY EMBODIMENTS

Figure 1A:
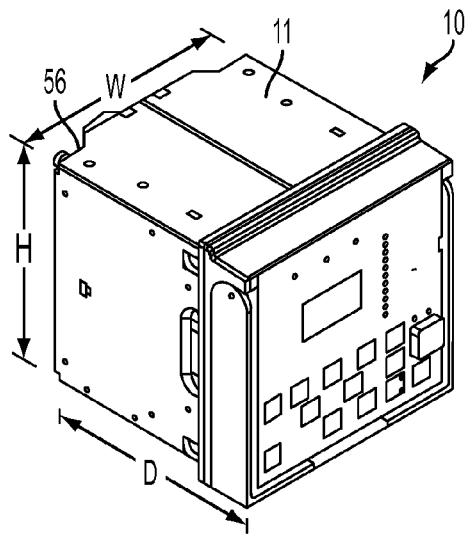
FIG. 1A is a perspective view of an IED having a particular form factor for vertically mounted hardware modules.
Figure 1B:
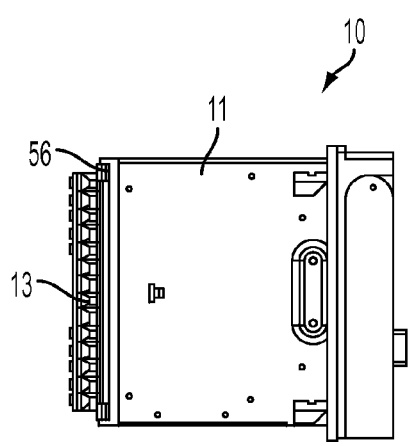
FIG. 1B is a side view of the IED of FIG. 1A.
Figure 4:
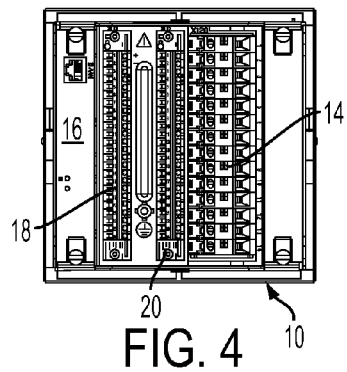
FIG. 4 is a top view showing internal components of the IED of FIG. 1.

With reference to FIGS. 1A, 1B and 4, an IED is shown, generally indicated at 10, having a housing 11 with a form factor enabling mounting of hardware modules and circuit boards in a vertical arrangement therein. The modules are directly electrically connected to connections 13 at a rear of the IED 10 and to connectors (not shown) adjacent to the front panel 15. The IED 10 has a height H of 6.97", a width W of 6.97" and a depth D of 7.91". The IED 10 is used for protection, management and supervision of utility substations and industrial power systems.

Figure 2:
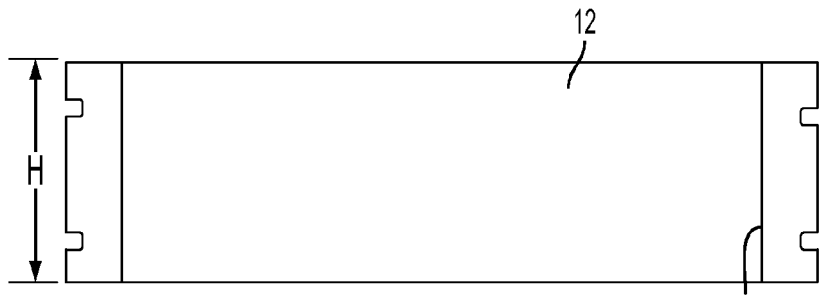
FIG. 2 is front view of a housing for an IED having a form factor for horizontal mounting of hardware modules.
Figure 3:
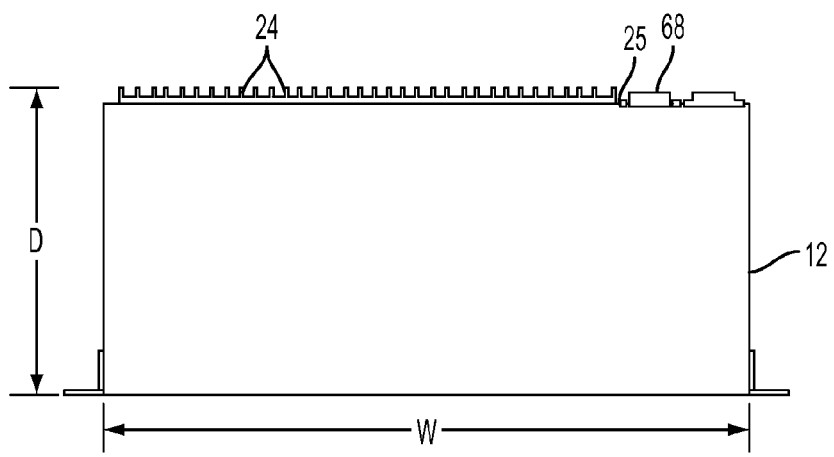
FIG. 3 is a top view of the IED housing of FIG. 2.

As noted above, there are times when replacing older IEDs with newer ones is needed. FIGS. 2 and 3 shows an older type IED housing 12 that has a form factor for enabling the hardware modules to be mounted in a horizontal arrangement therein. The housing 12 of the embodiment has a height H of 5.22", a width W of 17.12" and a depth D of 9.00" (for 19" U form-factor). Below, a process and components are described that enables the hardware modules and circuit boards made for the IED of FIGS. 1A, 1B, and 4 to be used in the housing 12 of FIGS. 2 and 3 so that the customer can transfer and integrate current technology into an older type IEDs form factor, while advantageously keeping the customer wiring locations unchanged.

Figure 5A:
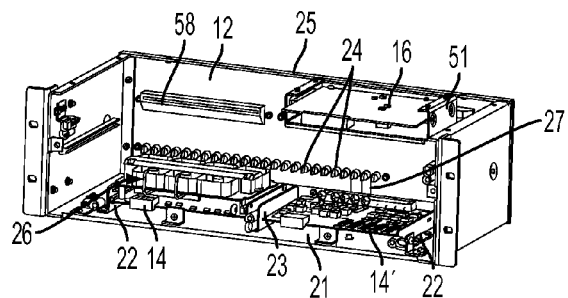
FIG. 5A is a view of an AIM module and a communication card of the IED of FIG. 4, now mounted in the IED housing of FIG. 2.
Figure 5B:
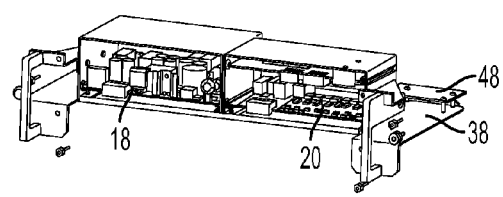
FIG. 5B is a view of PSM and BIO modules of the IED of FIG. 4, shown ready to be mounted in the IED housing of FIG. 5A.

FIG. 4 shows a top view showing internal components of the IED of FIG. 1A. FIG. 5A shows analog input modules (AIM) 14, 14' and a communication (COM) card 16 of the IED of FIG. 4, now mounted in the IED housing 12 of FIG. 2. FIG. 5B shows a Power Supply Module (PSM) 18 and a Binary Input/Output (BIO) module 20 of the IED of FIG. 4, shown ready to be mounted in the IED housing 12 of FIG. 5A.

With reference to FIG. 5A, in the embodiment, the AIM boards or modules 14, 14' are fixed in a horizontally adjacent manner to the bottom panel 21 inside of the housing 12 using L brackets 22 and U brackets 23. Manual wiring, shown for example at 27, electrically connects the modules 14, 14' to the connectors 24 in electrical communication with connections accessible at the back panel 25 of the housing 12. The primary current transformers (CTs) 26 are connected to one of the modules, e.g., module 14. The AIM modules 14, 14' can be wired with or without a Make-Before-Break (MBB) interface while maintaining full functionality and protection for the secondary CT winding. This is achieved by allowing the assembly of the boards that hold the primary CTs to be either removable in a draw-out mechanism, or be fixed within the housing 12 with constant contact with the secondary CTs and hence does not need a MBB mechanism.

Figure 6:
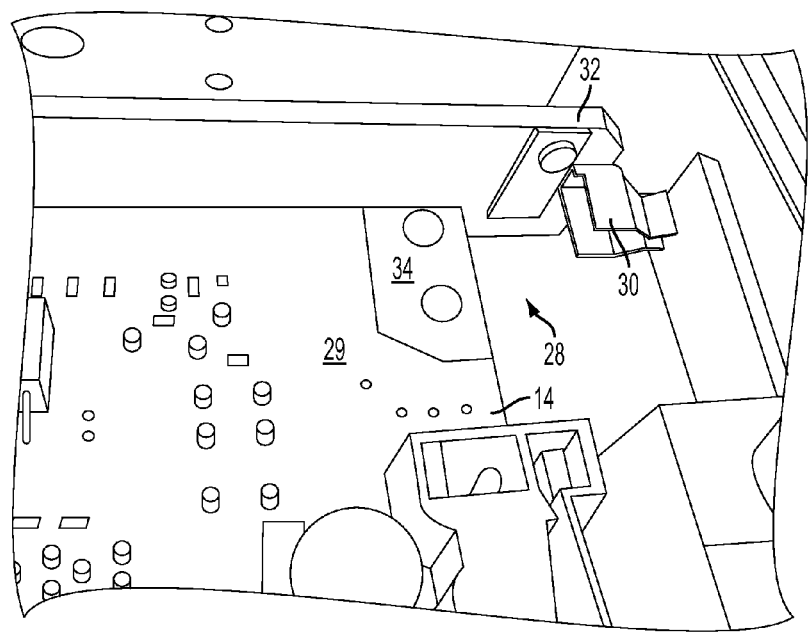
FIG. 6 shows grounding structure for electrically grounding an AIM module of FIG. 5.

One of the challenging tasks of any electrical enclosure is electrical grounding. With reference to FIG. 6, grounding structure, for electrically grounding the AIM module 14, is shown generally indicated at 28. The grounding structure 28 includes a metal, spring-loaded clip 30 fixed to a metal bracket 23, which is used to mount the module 14 to the metal bottom panel 21. A corner of the printed circuit board (PCB) 29 of the module 14 includes a grounding pad 34, defining the grounding contact area for the module 14. As the module 14 is assembled onto the housing 12, the grounding pad 34 is moved into engagement with the clip 30. The spring function the clip 30 keeps it engaged with the grounding pad 34 to thereby electrically ground the module 14. Similar grounding structure 28 can be used to ground the module 14'.

Figure 7:
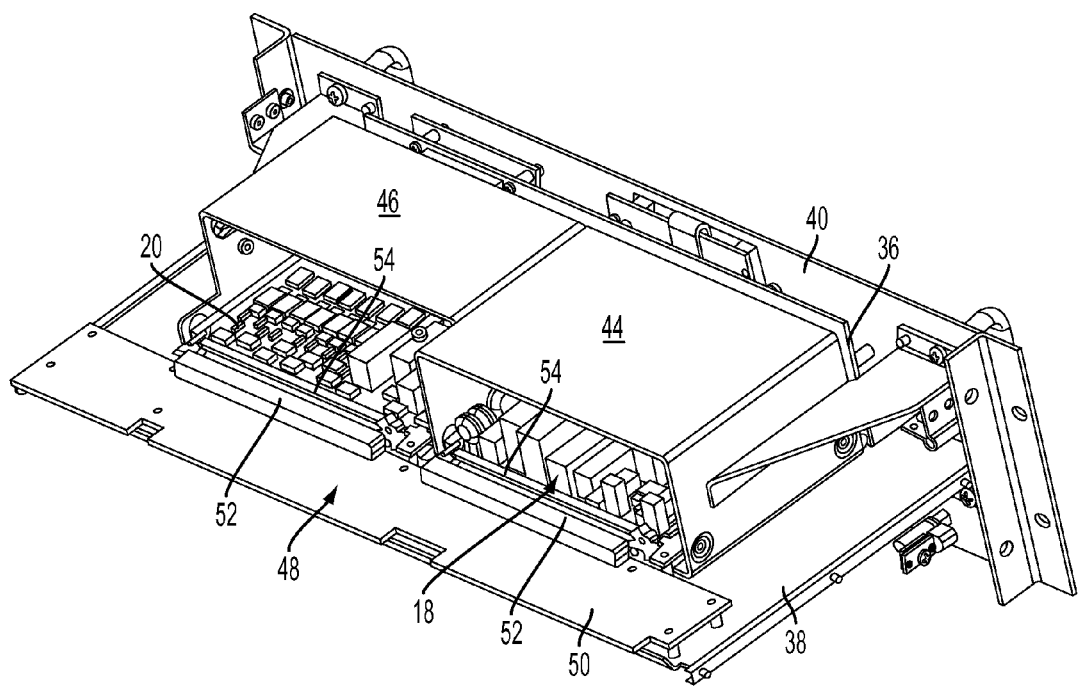
FIG. 7 is a rear perspective view of modules of FIG. 5B shown connected with a back panel of an IED suitable for mounting in the housing of FIGS. 2 and 3, and also connected with a first adaptor structure, in accordance with an embodiment.

The innovative horizontal mounting of the AIMs 14, 14' and manual wiring provides the following:

1) removal of Make Before Break (MBB) mechanism as used in vertical mounting, since the AIMs in the horizontal mounting configuration are not part of a draw-out assembly, 2) addition of another primary winding with longer leads allows easy connection to the terminal block, while original primary winding with its leads allow the use of existing module tester, 3) multiple CT primary wiring that allows both conventional vertical mounting and testing with and without MBB, as well as horizontal mounting, 4) new grounding structure 28, in the two ground corners for PCB board of each module, as shown in FIG. 6 for horizontal mounting, 5) the L brackets 22 and U brackets 23 hold the modules and PCBs thereof and help to align them to the connectors at the backplane 36 (see FIG. 7).

Figure 8:
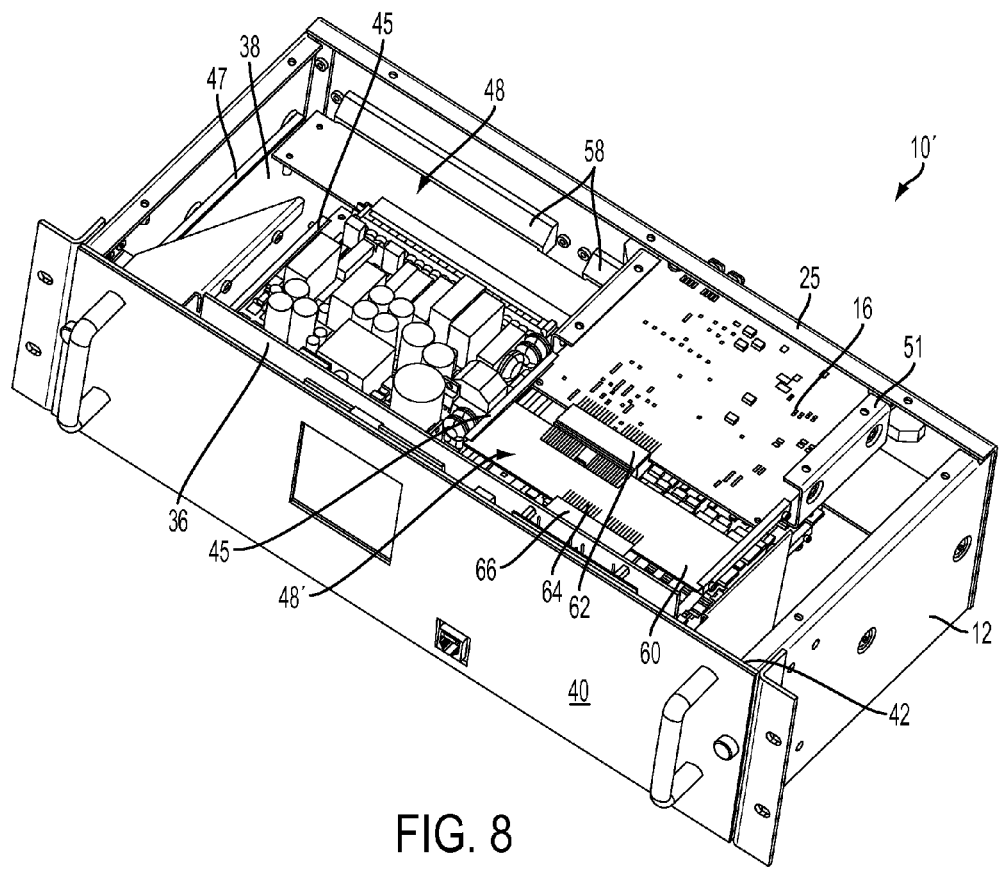
FIG. 8 is a front perspective view of an IED having the modules of FIG. 7 along with a communication module disposed the housing of FIGS. 2 and 3, and connected with a second adaptor structure, in accordance with the embodiment.

With reference to FIG. 7, the PSM 18 the BIO circuit board or module 20 are shown mounted in a horizontally adjacent manner to a tray 38 that is coupled to a front panel 40. The new front panel 40, for operator input, is coupled to an open end 42 of the housing 12 (FIG. 8). The entire assembly of FIG. 7 is removable or can be drawn-out from the housing 12 for maintenance and/or for accessing the AIM modules 14, 14' that are spaced below the tray 38 in the IED 10' of FIG. 8.

A protective cover 44 is provided over the module 18 and a second protective cover 46 is provided over the module 20. The covers 44, 46 provide EMC immunity to the PSM and BIO module. The covers 44, 46 also allow the use of guide rails 45 inside the covers, which help in the alignment of the modules 18, 20 with respect to the connectors on the backplane 36. Grounding is provided through stand-offs connecting the metal tray 38 to plated ground holes on the PSM and BIO circuit boards. The covers are secured to the tray 38 by metal screws. The tray 38 is engaged with electrically conductive guide rails 47 that are connected to the housing 12.

As noted above, the modules 18 and 20 are of the type configured for vertical mounting in housing 11 (FIG. 1A) and include current or updated technology. To be used in the older type, second housing 12 and mounted horizontally adjacent therein, first adaptor structure, generally indicated at 48 (FIG. 7), is provided. In the embodiment, the first adaptor structure 48 is preferably a rigid printed circuit board 50 having connectors 52 thereon that receive mating connectors 54 of the modules 18 and 20, which would otherwise been connect directly to connectors 13 associated with the back panel 56 of the IED 10 of FIG. 1B. With reference to FIG. 8, the circuit board 50 is also connected to associated connectors 58 that are in electrical communication with certain of the connections on the back panel 25 of the housing 12. Thus, the circuit board 50 bridges the physical gap between the modules 18 and 20 and the back panel 25. Connection between PSM and BIO module to the external Input/outputs is achieved through the circuit board 50. It is noted that the covers 44 and 46 are not shown in FIG. 8 for clarity of illustration.

With reference to FIG. 8, a second adaptor structure 48' is employed to connect the communication (COM) circuit board or card 16 to the backplane 36 rather than connecting the COM card 16 directly to the backplane as in the IED 10 of FIG. 1A. In the embodiment, the second adaptor structure 48' is preferably a rigid printed circuit board 60 having a connector 62 that receives a mating portion of the COM card 16. A portion 64 of the circuit board 60 is electrically received by an associated connector 66 of the backplane 36, which is adjacent to the front panel 40 of the housing 12. Thus, the circuit board 60 bridges the physical gap between the COM card 16 and the backplane 36. This arrangement facilitates the access of the COM ports 68 (FIG. 3) from the back panel 25 by providing the ports 68 in the same plane like other rear terminals. The COM card 16 is fixed to the housing 12 by using a mounting holder 51 hanging from the top panel (not shown) of the housing 12.

Thus, the utilization of the adapter structures 48, 48' to electrically connect the hardware modules 18, 20 (configured for a first form factor) within the housing 12 (configured for a second form fact that is different from the first form factor), allows power utilities to adopt state of the art technology for their IEDs, without the need to change the physical wiring locations and input/output interface associated with the housing 12.

Figure 9:
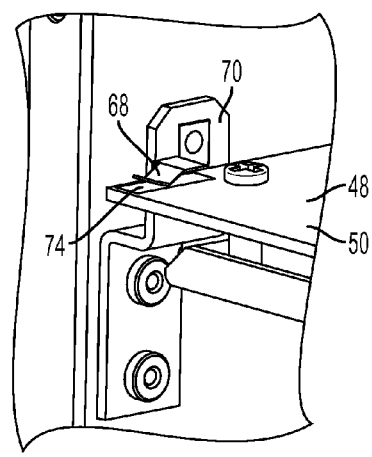
FIG. 9 is a view of grounding structure for electrically grounding the adaptor structure in accordance with and embodiment.

The adaptor structures used in the embodiment are used to extend user interface inputs and outputs from one form factor to another. Appropriate grounding of the adaptor structures can be achieved with the use of springs, brackets, or the like. For example, FIG. 9 shows grounding structure including a metal spring 68 fixed to a metal bracket 70 that is fixed to a metal side 72 of the housing 12. A corner of the printed circuit board 50 includes a grounding pad 74, defining the grounding contact area for the module 14. As the circuit board 50 is assembled onto the housing 12, the grounding pad 74 is moved into engagement with the spring 68. The spring force of the spring 68 keeps it engaged with the grounding pad 74 to thereby electrically ground the adaptor structure 48. Similar grounding structure can be used to ground the adaptor structure 48'.

Instead of using circuit boards as the first and second adaptor structures, ribbons, flexible cables, or flexible circuit boards can be employed having the appropriate electrical connections.

Advantages and benefits of the embodiments include:

1) IED users will be able to integrate state of the art technological advancement in the IED industry in existing environments (e.g., racks of the form factor of housing 12) without having to re-wire and change input/output interfacing to their existing IEDs.

2) Since these newer IEDs are compatible in form-factor and are wire-alike, they will allow a drop-in replacement which will shorten the IED replacement time, and hence the outage time for such replacement.

3) Since these newer IEDs provide customers with state-of-the-art technology with a reduced replacement overhead, they will give the manufacturer an edge for faster and more efficient retrofit application of their products into the market.

4) The adaptor structure 48, 48' application will allow the use of hardware modules configured for an IED (X) having one form factor, to be used for another IED (Y) with a different form factor. The adaptor structures will allow IED (X) to be wired-alike and form-factor-alike as the IED (Y).

5) The flexibility to adopt any hardware of one form-factor to a different IED form factor and wire-alike mentioned in (4) could be extended to allow adaptability between any two IEDs regardless of their manufacturer.

6) Using platform PCBs designed for different form-factors without any PCB modifications makes it possible to use same module and product testing harnesses and tools for new the products.

7) Employing new grounding structures for the modules and PCBs for a different form factor, yet commonly grounding through the housing 12.

8) The use of covers and/or brackets for using hardware modules and PCBs configured for one for factor in another form factor.

9) The provision for high precision alignment using a guide-rails and alignment pins in select locations. For example, alignment can be achieved to enable aligning two 55 pin connectors and one 110 pin connector with pin diameter of 0.6 mm, and tolerance of 5 mils. The connectors in this example are on three different planes.

The foregoing preferred embodiments have been shown and described for the purposes of illustrating the structural and functional principles of the present invention, as well as illustrating the methods of employing the preferred embodiments and are subject to change without departing from such principles. Therefore, this invention includes all modifications encompassed within the spirit of the following claims.

What is claimed is:

1. A method of providing an Intelligent Electronic Device (IED) with new hardware modules, the method comprising:
providing hardware modules including a pair of analog input modules (AIMs), a Power Supply Module (PSM), and a Binary Input/Output (BIO) module, each module being mounted in a first IED housing that has a first form factor, with the PSM and BIO module each being directly connected with electrical connections of the first IED housing,
removing the AIMs, PSM and BIO module from the first IED housing;
providing a second IED housing having a second form factor that is different from the first form factor,
mounting the AIMs in the second IED housing,
wiring the AIMs to connections at a back panel of the second IED housing,
mounting the PSM and the BIO module in the second IED housing, and
employing adaptor structure to electrically connect the PSM and the BIO module with associated connections of the second IED housing.

2. The method of claim 1, wherein the step of employing the adaptor structure includes electrically connecting a first adaptor structure between the PSM and the BIO module, and the connectors at a back panel of the second IED housing.

3. The method of claim 2, further comprising the steps of:
providing a communication (COM) card having communication ports accessible at a back panel of the second IED housing, and
employing a second adaptor structure electrically connected between the COM card and a connector of a backplane adjacent to a front panel of the second IED housing.

4. The method of claim 3, wherein the steps of employing the first and second adaptor structures includes using a printed circuit board as each adaptor structure.

5. The method of claim 1, wherein the step of mounting the AIM includes fixing the AIMs, in a horizontally adjacent manner, to a bottom panel of the second IED housing.

6. The method of claim 5, wherein the step of mounting the PSM and the BIO module includes mounting the PSM and the BIO module in a horizontally adjacent manner to a tray and mounting the tray to the second IED housing in a removable manner with the tray being spaced above the AIMs, and wherein the tray is coupled to a front panel of the second IED housing.

7. The method claim 1, further comprising step of electrically grounding each of the hardware modules and the adaptor structure through the second IED housing.

8. The method of claim 7, wherein the step of grounding at least one of the AIMs comprises the steps of:
coupling a metal spring-loaded clip to a bracket that couples the AIM to a bottom panel of the second IED housing,
providing a grounding pad on a surface of the AIM, and engaging the clip with the grounding pad.

9. The method of claim 1, further comprising the step of connecting primary current transformers to one of the AIMs.

10. An Intelligent Electronic Device (IED) comprising:
a plurality of hardware modules including a pair of analog input modules (AIMs), a Power Supply Module (PSM), and a Binary Input/Output (BIO) module, each module configured for mounting in a first IED housing that has a first form factor, with the PSM and BIO module being constructed and arranged to directly connect with electrical connections of the first IED housing, a second IED housing having a second form factor that is different from the first form factor, the AIMs being mounted to a bottom panel of the second IED housing, the PSM and the BIO module being mounted in the second IED housing, wiring electrically connecting the AIMs to connections on the second IED housing, and adaptor structure electrically connecting the PSM and the BIO module with associated connections of the second IED housing.

11. The device of claim 10, wherein the adaptor structure includes a separate first adaptor structure electrically connected between the PSM and the BIO module, and the associated connectors at a back panel of the second IED housing.

12. The device of claim 11, further comprising:
a communication (COM) card having communication ports accessible at a back panel of the second IED housing, and
a separate second adaptor structure electrically connected between the COM card and a connector of a backplane adjacent to a front panel of the second IED housing.

13. The device of claim 12, wherein each of the first and second adaptor structures includes a printed circuit board.

14. The device of claim 10, wherein the AIMs are fixed in a horizontally adjacent manner to a bottom panel of the second IED housing.

15. The device of claim 14, wherein the PSM and the BIO module are mounted in a horizontally adjacent manner to a tray and the tray is mounted to the second IED housing in a removable manner with the tray spaced above the AIMs, and wherein the tray is coupled to a front panel of the second IED housing.

16. The device of claim 10, further comprising grounding structure electrically grounding each of the hardware modules and the adaptor structure through the second IED housing.

17. The device of claim 16, wherein the grounding structure includes a metal spring-loaded clip coupled to a bracket that couples the AIM me-d-u-le to a bottom panel of the second IED housing, and a grounding pad on a surface of the AIM, the clip engaging the pad.

18. The device of claim 10, further comprising primary current transformers connected to one of the AIMs.

19. The device of claim 10, wherein the second housing has a height of 5.22", width of 17.12" and depth of 9.00".

* * * * *